United States Patent
Klein

(10) Patent No.: US 8,623,694 B2
(45) Date of Patent: Jan. 7, 2014

(54) METHODS OF FORMING FAST ION CONDUCTORS AND MEMORY DEVICES COMPRISING DIFFUSED METAL IONS

(75) Inventor: Rita J. Klein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 12/763,430

(22) Filed: Apr. 20, 2010

(65) Prior Publication Data

US 2010/0273305 A1 Oct. 28, 2010

Related U.S. Application Data

(63) Continuation of application No. 11/872,227, filed on Oct. 15, 2007, now Pat. No. 7,700,485, which is a continuation of application No. 11/265,449, filed on Nov. 2, 2005, now Pat. No. 7,282,387, which is a continuation of application No. 09/956,783, filed on Sep. 20, 2001, now Pat. No. 7,109,056.

(51) Int. Cl.
| | |
|---|---|
| H01L 21/00 | (2006.01) |
| H01L 21/26 | (2006.01) |
| H01L 21/42 | (2006.01) |
| H01L 21/22 | (2006.01) |
| H01L 21/38 | (2006.01) |
| H01L 21/44 | (2006.01) |

(52) U.S. Cl.
USPC ............. 438/95; 438/535; 438/558; 438/678; 257/E31.029

(58) Field of Classification Search
USPC ............................ 438/95, 678; 257/E31.029
See application file for complete search history.

(56) References Cited

U.S. PATENT DOCUMENTS

| | | | | |
|---|---|---|---|---|
| 4,127,414 A | * | 11/1978 | Yoshikawa et al. | 430/270.1 |
| 5,130,172 A | * | 7/1992 | Hicks et al. | 427/584 |
| 5,314,772 A | * | 5/1994 | Kozicki et al. | 430/14 |
| 5,468,919 A | * | 11/1995 | Shiozaki et al. | 174/261 |

(Continued)

OTHER PUBLICATIONS

Definition of plate. (n.d.) The American Heritage® Dictionary of the English Language, Fourth Edition. (2003). Retrieved May 7, 2013 from http://www.thefreedictionary.com/plate.*

(Continued)

Primary Examiner — Michael Jung
(74) Attorney, Agent, or Firm — TraskBritt

(57) ABSTRACT

Non-volatile, resistance variable memory devices, integrated circuit elements, and methods of forming such devices are provided. According to one embodiment of a method of the invention, a memory device can be fabricated by depositing a chalcogenide material onto a first (lower) electrode, sputter depositing a thin diffusion layer of a conductive material over the chalcogenide material, diffusing metal from the diffusion layer into the chalcogenide material, resulting in a metal-comprising resistance variable material, and then plating a conductive material to a desired thickness to form a second (upper) electrode. In another embodiment, the surface of the chalcogenide layer can be treated with an activating agent such as palladium, a conductive metal can be electrolessly plated onto the activated areas to form a thin diffusion layer, metal ions from the diffusion layer can be diffused into the chalogenide material to form a resistance variable material, and a conductive material plated over the resistance variable material to form the upper electrode. The invention provides a process for controlling the diffusion of metal into the chalcogenide material to form a resistance variable material by depositing the mass of the upper electrode by a metal plating technique.

14 Claims, 8 Drawing Sheets

(56) References Cited

U.S. PATENT DOCUMENTS

| | | | |
|---|---|---|---|
| 5,761,115 A * | 6/1998 | Kozicki et al. | 365/182 |
| 5,914,893 A | 6/1999 | Kozicki et al. | |
| 5,925,415 A | 7/1999 | Fry et al. | |
| 5,973,911 A * | 10/1999 | Nishioka | 361/313 |
| 6,084,796 A | 7/2000 | Kozicki et al. | |
| 6,111,264 A | 8/2000 | Wolstenholme et al. | |
| 6,189,582 B1 | 2/2001 | Reinberg et al. | |
| 6,348,365 B1 | 2/2002 | Moore et al. | |
| 6,375,062 B1 | 4/2002 | Higdon et al. | |
| 6,503,830 B2 | 1/2003 | Miyata | |
| 6,518,198 B1 | 2/2003 | Klein | |
| 6,638,820 B2 | 10/2003 | Moore | |
| 6,653,193 B2 | 11/2003 | Gilton | |
| 6,660,136 B2 | 12/2003 | Li et al. | |
| 6,709,887 B2 | 3/2004 | Moore et al. | |
| 6,709,958 B2 | 3/2004 | Li et al. | |
| 6,710,423 B2 | 3/2004 | Moore et al. | |
| 6,727,192 B2 | 4/2004 | Moore et al. | |
| 6,730,547 B2 | 5/2004 | Li et al. | |
| 6,751,114 B2 | 6/2004 | Gilton et al. | |
| 6,784,018 B2 | 8/2004 | Campbell et al. | |
| 6,800,504 B2 | 10/2004 | Li et al. | |
| 6,812,087 B2 | 11/2004 | Giltom et al. | |
| 6,881,623 B2 | 4/2005 | Campbell et al. | |
| 6,955,940 B2 | 10/2005 | Campbell et al. | |
| 7,071,021 B2 * | 7/2006 | Harshfield et al. | 438/95 |
| 7,102,150 B2 * | 9/2006 | Harshfield et al. | 257/2 |
| 7,109,056 B2 | 9/2006 | Klein | |
| 7,282,387 B2 | 10/2007 | Klein | |
| 2002/0098711 A1 | 7/2002 | Klein | |
| 2002/0123248 A1 | 9/2002 | Moore et al. | |
| 2002/0168852 A1 | 11/2002 | Harshfield et al. | |
| 2003/0027416 A1 | 2/2003 | Moore | |
| 2003/0153143 A1 | 8/2003 | Klein | |
| 2003/0215978 A1 | 11/2003 | Maimon et al. | |

OTHER PUBLICATIONS

Wolf et al., Silicon Processing for the VLSI ERA vol. 1: Process Technology; p. 161; Lattice Press, 1986; Sunset Beach, California.

Günter Holzäpfel, Solid-State Electrochemistry, Encyclopedia of Physical Sci. & Tech., 2003, pp. 301-316, 3d ed., Academic Press, United States.

H. Ogawa & M. Kobayashi, Cross Conduction in Superionic Conductors, Solid State Ionics, 1997, pp. 95-98, vol. 96, Elsevier.

M. Ribes et al., Non-Arrhenius Conductivity in Glassy and Crystallized Fast Ion Conductors: A Manifestation of Cationic Disorder, Solid State Ionics, 1998, pp. 159-165, vol. 105, Elsevier.

P.R. Slater, Fast Ion Conductors, Encyclopedia of Materials: Sci. & Tech., 2001, pp. 2848-2854, 2d ed., Elsevier, United Kingdom.

C. S. Sunandana, A Crystallo-Chemical Approach to Superionics, J. Physics & Chemistry of Solids, 1997, pp. 1359-1365, vol. 58, No. 9, Elsevier Science Ltd., United Kingdom.

* cited by examiner

METHODS OF FORMING FAST ION CONDUCTORS AND MEMORY DEVICES COMPRISING DIFFUSED METAL IONS

CROSS-REFERENCE TO RELATED APPLICATIONS

This application is a continuation of U.S. patent application Ser. No. 11/872,227, filed Oct. 15, 2007, now U.S. Pat. No. 7,700,485, issued Apr. 20, 2010, which is a continuation of U.S. patent application Ser. No. 11/265,449, filed Nov. 2, 2005, now U.S. Pat. No. 7,282,387, issued Oct. 16, 2007, which is a continuation of U.S. patent application Ser. No. 09/956,783, filed Sep. 20, 2001, now U.S. Pat. No. 7,109,056, issued Sep. 19, 2006.

TECHNICAL FIELD

The present invention relates generally to semiconductor fabrication techniques and, more particularly, to a method for fabricating electrodes for use in phase changeable or resistance variable memory devices such as, for example, chalcogenide-based memory cells.

BACKGROUND

Memory devices are used in integrated circuitry to store information in the form of binary data. There are various types of memory devices, including volatile semiconductor memory in which stored data is retained as long as power to the system is not turned off, such as dynamic random access memory (DRAM). Non-volatile memory, such as read-only memory (ROM), retains stored data even when power is discontinued, but has less storage capability and programming options than volatile memory. Although there is non-volatile memory, such as programmable read-only memory (PROM) and electrically erasable PROM (EEPROM) that permit limited reprogramming, there are limits on the programming capacity of such memory devices.

Programmable metallization cells (PMCs) comprise a fast ion conductor or resistant variable material, typically a chalcogenide material having metal ions therein, which is disposed between two electrodes comprising an electrically conducting material (e.g., an anode and a cathode), as described, for example, in U.S. Pat. No. 6,084,796 (Kozicki et al., Axon Technologies). Resistant variable materials (or fast ion conductors) are capable of assuming a high resistance "off" state and a low resistance "on" state, in response to a stimulus for a binary memory, and multiple generally stable states, in response to a stimulus for a higher order memory. The resulting memory element is non-volatile in that it will maintain the integrity of the information stored by the memory cell without the need for periodic refresh signals, and the data integrity of the information stored by these memory cells is not lost when power is removed from the device.

The resistant variable material (e.g., chalcogenide-metal ion material) undergoes a chemical and structural change at a certain applied voltage. Specifically, at a threshold voltage, plating of metal from metal ions occurs. A metal dendrite grows within the chalcogenide-metal ion material, eventually connecting the two electrodes. The growth rate of the dendrite is a function of the applied voltage and time. The growth of the dendrite can be stopped by removing the voltage, or the dendrite can be retracted back towards the cathode by reversing the voltage polarity at the anode and cathode.

Changes in the length of the dendrite affect the resistance and capacitance of the PMC. If dendrite growth is continued until it effectively interconnects the electrodes to electrically short them together, a drop in the resistance of the resistance variable material results. The resistance variable material can be returned to a highly resistive state by reversing the voltage potential between the anode and cathode, whereupon the dendrite is disrupted. Thus, such a device can function as a programmable memory cell of a memory circuitry.

An exemplary resistance variable material comprises germanium selenide with silver ions diffused therein. Current methods provide silver ions within the germanium selenide material by initially depositing a germanium selenide glass layer onto a substrate, typically a first electrode, and then depositing a thin overlying layer of silver, typically by physical vapor deposition (i.e., sputtering). The thin silver layer is then exposed to electromagnetic energy, such as ultraviolet (UV) radiation, to diffuse silver into the germanium selenide layer, such that a homogenous distribution of silver throughout the layer is ultimately achieved. In an exemplary embodiment, the upper electrode is then formed from silver that is sputter deposited onto the metal-doped germanium selenide layer.

In the process of depositing silver to form the upper electrode, plasma generated during sputtering results in the generation of electromagnetic radiation, which drives additional silver into the metal-doped material. Although some doping of silver into the material is needed to provide a working device, whereby silver from silver ions within the material plates out to grow the dendrite extension between the two electrodes, the amount of electromagnetic radiation generated during the sputtering process can drive excessive amounts of silver into the resistance variable material such that the device is rendered non-functional.

Therefore, a need exists for a process for fabricating memory cells comprising a resistance variable material that avoids such problems.

SUMMARY

The present invention relates generally to semiconductor fabrication techniques and, more particularly, to non-volatile, resistance variable memory devices such as, for example, chalcogenide memory cells, and methods of forming such devices, and more particularly to the fabrication of electrodes on resistance variable materials of an integrated circuit element.

In one aspect, the invention provides methods of forming a memory device comprising a resistance variable material interposed between an upper electrode and a lower electrode. In an embodiment of a method according to the invention, a lower electrode layer is formed on a substrate, a chalcogenide material is deposited onto the lower electrode, and a thin diffusion layer comprising a conductive metal, such as silver, is formed over the chalcogenide material for example, by physical vapor deposition (i.e., sputtering) or by chemical vapor deposition (CVD), and then a conductive metal is plated onto the diffusion layer to a desired thickness to form the upper electrode. Metal ions from the diffusion layer are diffused into the chalcogenide material prior to plating the upper electrode, resulting in a metal-comprising resistance variable material. In another embodiment, a thin seed layer of conductive metal is deposited onto the resistance variable material layer and/or the diffusion layer, followed by plating of a conductive metal to form the upper electrode.

In an exemplary embodiment of the method, a layer of germanium selenide material is deposited, for example, by chemical vapor deposition or sputtering, onto a lower electrode layer that can comprise, for example, silver, tungsten, platinum, or other conductive material. A silver material is sputter deposited onto the germanium selenide layer to form a thin diffusion layer, preferably to a thickness of at least about 100 angstroms to about 300 angstroms or less. The diffusion layer can then be exposed to electromagnetic radiation or other diffusion source to diffuse silver ions into the germanium selenide layer to form the resistance variable material. A conformal layer of a conductive material, such as silver, is then plated over the diffusion layer by an electroplating or an electroless plating process to a desired thickness to form the upper electrode, typically about 500 to about 2000 angstroms. A seed layer can be deposited as a base for the upper electrode deposition, if appropriate.

In another embodiment of a method of the invention, the upper electrode is formed over a chalcogenide material by first contacting the chalcogenide material with a surface activating agent, to form an activated surface area, and then electroless plating a conductive metal (e.g., silver) onto the activated surface area to form a thin diffusion layer. An exemplary surface activating agent is palladium. Metal ions from the plated diffusion layer can then be diffused into the chalcogenide material, resulting in a metal-comprising resistance variable material. The upper electrode is then formed by electroless plating or electroplating a conductive material (e.g., silver) to a desired thickness over the diffusion layer. A thin seed layer, if appropriate, can be deposited by plating prior to plating of the upper electrode.

In another aspect, the invention provides methods of diffusing metal ions into a chalcogenide material to form a resistance variable material. One embodiment of the method comprises sputter or CVD depositing a conductive metal material onto a chalcogenide material, to form a thin diffusion layer, and treating the diffusion layer to diffuse metal ions from the conductive metal material into the chalcogenide material, for example, by exposure to electromagnetic radiation. In another embodiment of a method of diffusing metal into a chalcogenide material to form a resistance variable material, the chalcogenide material is contacted with a surface activating agent to form an activated surface area thereon, a layer of metal is plated onto the activated surface area by an electroless plating process to form a diffusion layer of about 100 angstroms to about 300 angstroms, and metal ions from the diffusion layer can then be diffused into the chalcogenide material such as by exposure to electromagnetic radiation. In either embodiment, a layer of a conductive metal material can then be plated onto the diffusion layer to a desired thickness to form the upper electrode by electroplating or electroless plating techniques. In another embodiment, a thin seed layer can be deposited as a base layer prior to plating the metal electrode layer. In an exemplary embodiment, the chalcogenide material comprises germanium selenide, and both of the diffusion layer and the electrode layer comprise silver. The diffusion layer is preferably deposited to a thickness of about 100 angstroms to about 300 angstroms.

In another aspect, the invention provides a semiconductor circuit comprising a semiconductor structure comprising a resistance variable material interposed between and in electrical contact with first and second electrodes. The resistance variable material comprises a chalcogenide material having metal ions dispersed therethrough. In one embodiment of the semiconductor circuit, a diffusion layer comprising a sputter-deposited (or CVD-deposited) conductive metal is disposed over the resistance variable material, and a plated layer of a conductive metal overlies the diffusion layer to form the second (upper) electrode. The conductive metal forming the second (upper) electrode can also be plated onto a thin seed layer of a conductive metal that is deposited onto the diffusion layer and/or the resistance variable material. The resistance variable material can be disposed within an opening through an insulative layer that overlies the first electrode.

In another embodiment of a semiconductor circuit, the semiconductor structure comprises a resistance variable material comprising a metal-chalcogenide material, sandwiched between an upper and lower electrode. A thin diffusion layer of an electrolessly plated conductive metal is disposed over an activated surface area overlying the resistance variable material, and a plated conductive metal layer overlies the diffusion layer to form the upper electrode. The activated surface area comprises a surface activating agent, for example, palladium. If appropriate, the plated conductive metal layer forming the upper electrode can overlie a plated seed layer of a conductive metal disposed over the diffusion layer and/or the resistance variable layer.

In yet another aspect, an integrated circuit is provided. In one embodiment, the integrated circuit comprises a substrate; a first electrode comprising a conductive material formed over the substrate; an insulating dielectric layer (if appropriate) formed over the first electrode with an opening formed into the insulating layer to expose the first electrode; a layer of a resistance variable material comprising a metal-chalcogenide material (formed in the opening) in electrical contact with the first electrode; a sputtered or CVD deposited diffusion layer overlying the resistance variable material; and a second electrode plated onto the diffusion layer or a thin seed layer (where appropriate). Where appropriate, an insulating dielectric layer is formed over the substrate, and the first electrode is formed over the insulating layer. In a preferred embodiment, the chalcogenide material comprises germanium selenide, the diffusion layer comprises silver and is preferably about 100 angstroms to about 300 angstroms thick, and the plated electrode layer comprises a solid silver layer.

In another embodiment of an integrated circuit according to the invention, the circuit comprises a substrate; a first electrode comprising a conductive material formed over the substrate; an insulating dielectric layer (if appropriate) formed over the first electrode with an opening formed into the insulating layer to expose the first electrode; a layer of a resistance variable material comprising a metal-chalcogenide material (formed in the opening) in electrical contact with the first electrode; an activated surface area formed over the resistance variable material and comprising a surface activating agent; an electrolessly plated diffusion layer formed over the activated surface area of the resistance variable material; and a second plated conductive metal formed over the diffusion layer to form an upper electrode. The conductive metal of the second electrode can be plated onto a metal seed layer. In a preferred embodiment, the chalcogenide material comprises germanium selenide, the surface activating agent comprises palladium, the diffusion layer comprises electrolessly plated silver, and the second electrode comprises a plated silver layer.

Conventional methods of diffusing metal into the chalcogenide material to form a resistance variable material layer, and then sputter depositing the upper electrode over the layer, results in excess metal ions being diffused into the chalcogenide material and a failed device. Advantageously, the present methods of sputtering (or CVD depositing) a very thin metal (e.g., silver) diffusion layer onto the surface of the chalcogenide layer, or electrolessly plating a diffusion layer onto the activated surface of the chalcogenide layer, and then plating additional metal over the diffusion layer to form the upper electrode is useful in controlling and reducing the diffusion of metal ions into the chalcogenide material and in forming memory devices comprising a resistance variable element that are operable and functional.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 3A' through 3C' are cross-sectional views of SEMs of the corresponding Controls for FIG. 3C.

DETAILED DESCRIPTION

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials, such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above. The terms "fast ion conductor" and/or "resistance variable material" refer to a metal ion-containing glass, a metal ion-containing amorphous semiconductor, a chalcogenide-metal ion, a superionic conductor, and the like.

FIGS. 1A through 1E depict a method of forming a nonvolatile resistance variable memory device according to a first embodiment of a method of the invention.

Figure 1A:
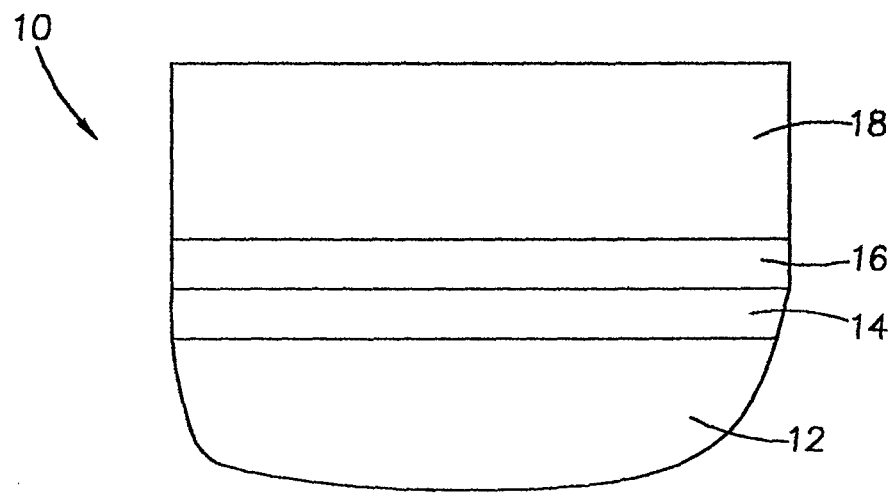
FIG. 1A is a diagrammatic cross-sectional view of a semiconductor wafer fragment at a preliminary step of a processing sequence.

Referring to FIG. 1A, a wafer fragment 10 is shown at a preliminary processing step in the formation of a resistance variable memory device. The wafer fragment 10 in progress can comprise a semiconductor wafer substrate or the wafer along with various process layers formed thereon, including one or more semiconductor layers or other formations, and active or operable portions of semiconductor devices.

The wafer fragment 10 comprises a substrate 12, such as plastic, glass, or semiconductor material, to provide support for the device. If appropriate, an overlying insulating layer 14, such as silicon dioxide, is provided to insulate the substrate 12 from the active portion of the device. A lower electrode 16 is formed over the insulating layer 14 (or over the substrate 12 if no insulating layer 14 is used). The lower electrode 16 can be formed on the insulating layer 14 or substrate 12 by methods known and used in the art. For example, the lower electrode 16 can be formed by depositing a thin metal seed layer or by activating the surface using an activating agent, such as palladium ($PdCl_2$), and then depositing a conductive metal to form the lower electrode 16 by electro- or electroless plating. The lower electrode 16 can constitute a patterned line over the insulating layer 14, and preferably comprises silver or other conducting material such as nickel, chromium, cobalt, molybdenum, tungsten, palladium, platinum, aluminum, titanium, copper, and carbon, or combinations and mixtures thereof, being tungsten in the illustrated example.

In an exemplary embodiment, a chalcogenide material 18 is deposited onto the lower electrode 16, as depicted in FIG. 1A. Chalcogenide materials are known in the art and include, but are not limited to, compounds having the formula $B_xA_y$, where "B" is arsenic (As) or germanium (Ge), and where "A" is selenium (Se), tellurium (Te), sulfur (S), or a mixture thereof. A preferred chalcogenide material 18 is represented by the formula $Ge_xA_y$ and includes, for example, germanium sulfide and germanium selenide. Another example of a chalcogenide material is represented by the formula $As_xA_y$, and includes, for example, arsenic sulfide and arsenic trisulfide ($As_2S_3$). The chalcogenide material 18 can be formed over the lower electrode 16 by methods known and used in the art, for example, by chemical vapor deposition, physical vapor deposition, or evaporation.

Figure 1B:
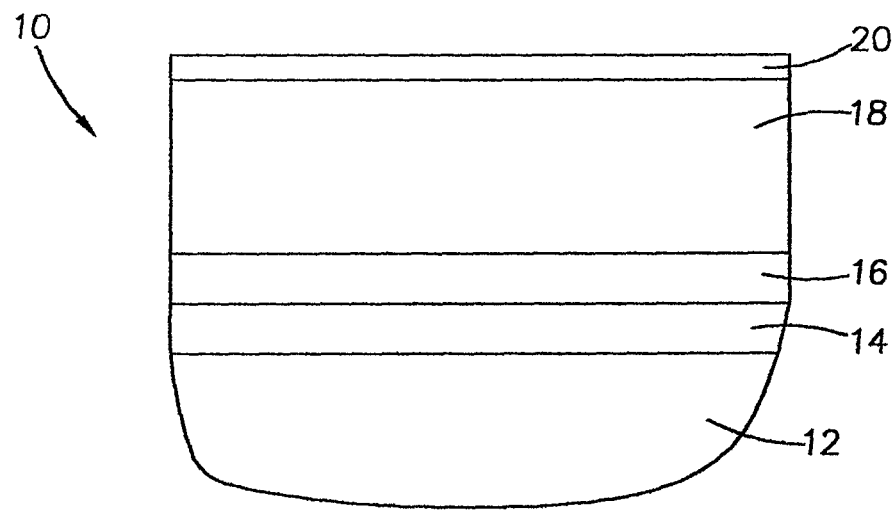
FIGS. 1B through 1E are views of the wafer fragment of FIG. 1A at subsequent and sequential processing steps, showing fabrication of an electrode according to an embodiment of the method of the invention.

According to the presently described embodiment of a method of the invention, a thin diffusion layer 20 is initially deposited onto the chalcogenide material 18, as depicted in FIG. 1B. The diffusion layer 20 can be deposited by chemical vapor deposition (CVD), and is preferably deposited by a conventional physical vapor deposition (i.e., sputtering) process. The diffusion layer 20 can comprise a conducting material, for example, silver, copper or zinc, being silver in the illustrated example.

As discussed above, sputter deposition of metal, such as silver, onto a germanium selenide or other chalcogenide material can result in excess diffusion of metal ions into the chalcogenide material due to UV radiation generated during prolonged sputtering, resulting in a failed device component. Therefore, it is desirable to limit the thickness of the sputtered diffusion layer 20 to lessen the amount of UV radiation that is generated, and minimize the diffusion of silver or other metal into the underlying chalcogenide material 18. The thickness of the diffusion layer 20 is preferably at least about 100 angstroms to about 300 angstroms.

Figure 1C:
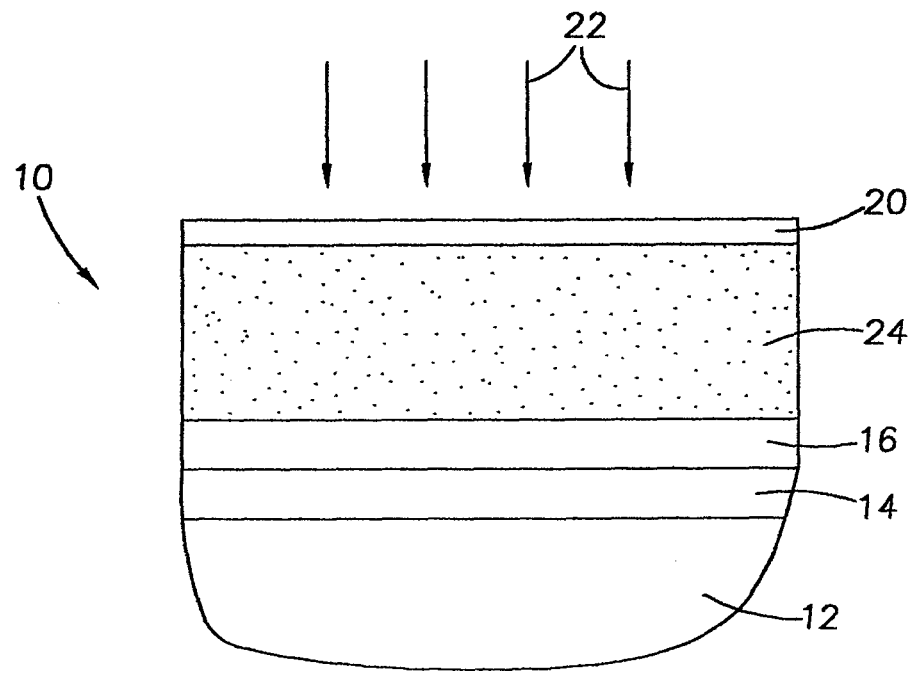

In the illustrated embodiment, the deposited silver diffusion layer 20 can then be treated by exposure to electromagnetic radiation or other diffusion source 22 to diffuse silver ions from the diffusion layer 20 into the underlying chalcogenide layer 18, resulting a metal-comprising resistance variable material or fast ion conductor layer, such as resistance variable material layer 24, as depicted in FIG. 1C. The substrate 12 can also be heated during an irradiation process, for example, to a temperature of about 65° C. to about 100° C. Since the present method forms an upper electrode 28 (FIG. 1D) by limiting sputtering of silver or other metal to form the thin diffusion layer 20 and plating the mass of the upper electrode 28, little electromagnetic radiation is produced during the formation of the upper electrode 28 such that only a minimal amount of metal ions is driven into the resistance variable material layer 24 during the formation of the upper electrode 28.

Figure 1D:
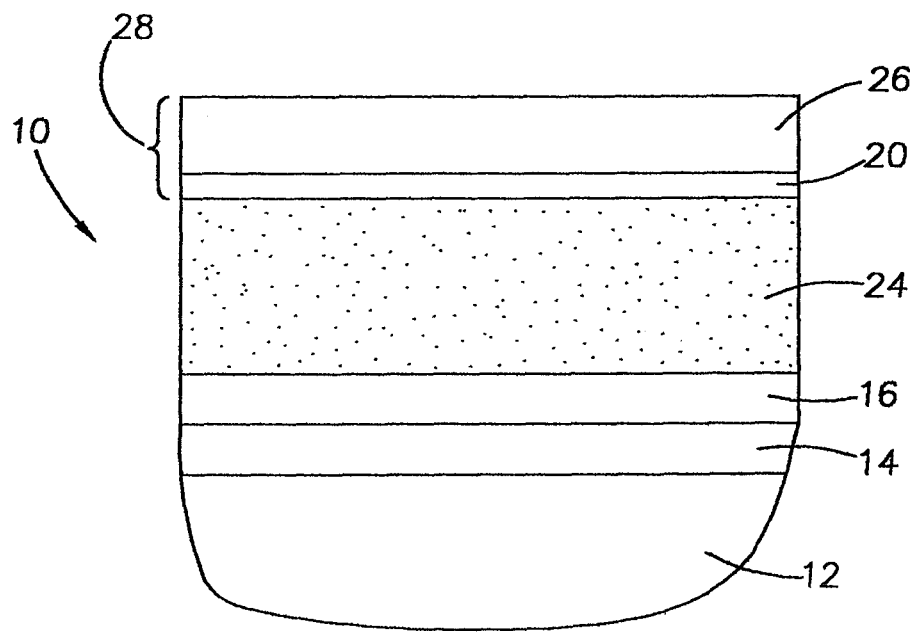

A conformal metal layer (e.g., plated electrode layer 26) is then plated over the diffusion layer 20, as depicted in FIG. 1D, to form the upper electrode 28. A conventional electroplating process or an electroless plating process can be used. Where the diffusion layer 20 has been consumed during the diffusing step of the metal ions and is less than about 100 angstroms, it is desirable to deposit a thin seed layer (not shown) onto the resistance variable material layer 24 (or remainder of the diffusion layer 20) to form a base for the subsequent deposition of the upper electrode 28. The seed layer can be deposited by CVD or PVD, but is preferably a plated layer. The upper electrode 28 preferably comprises silver or other conductive material such as copper, zinc, or platinum, among others, being silver in the illustrated example. The diffusion layer 20 (or seed layer) and the plated electrode layer 26 can comprise the same metal, or different metals if adherent to each other. Preferably, the diffusion layer 20 (or seed layer) and the plated electrode layer 26 comprise the same metal to achieve a high level of adhesion and conductivity between the two layers. Formation of the conformal plated electrode layer 26 progresses uniformly from the diffusion layer 20 (or seed layer if used) by the attachment or fusing of metal from the plating solution to the diffusion layer 20 (or seed layer).

In an example of a suitable silver electroplating process, the wafer fragment 10 is immersed in a bath comprising an aqueous solution of a silver salt, such as silver nitrate ($AgNO_3$), potassium silver cyanide ($KAg(CN)_2$), or silver succinimide ($C_4H_5O_2NAg$). Such silver plating baths are commercially available and used in the art. One preferred solution is a cyanide-free silver plating solution comprising silver succinimide ($C_4H_5O_2NAg$), which is available commercially under the trade name TECHNI SILVER® CY-Less L2 from Technic, Inc., Cranston, R.I.

A current is applied to reduce the metal ions and deposit a silver metal electrode layer (e.g., the plated electrode layer 26) onto the silver diffusion layer 20. The substrate 12 remains immersed in the solution bath and the current is applied until the desired thickness of silver is obtained, preferably a thickness of about to 400 angstroms to about 1500 angstroms, or a total thickness (of the diffusion layer 20 and the plated electrode layer 26) of about 500 angstroms to about 2000 angstroms. Preferably, the coating solution is gently agitated to more uniformly plate the electrode on the surface of the resistance variable material layer 24.

The current is terminated when the desired thickness is reached, and the substrate 12 is placed into a water rinse bath to remove residual bath liquid and particles from the surface of the wafer and then dried. The substrate 12 is then immersed in an organic solvent, such as acetone, or an alcohol, such as ethanol or isopropanol, that is miscible with the rinse liquid and with water, and then spin dried.

In another embodiment of a plating system, an electroless plating process can also be used to deposit a conformal metal plated electrode layer 26 (e.g., silver, copper) to form the upper electrode 28. In an exemplary electroless plating process for forming a silver electrode, the substrate 12 is immersed in a bath comprising an aqueous solution of a silver salt (e.g., $AgNO_3$, $KAg(CN)_2$), a chemical reducing agent, and optional additives as known and used in the art to control stability, film properties, deposition rates, and to build up the metal coating. The metal ions are reduced by reaction with the chemical reducing agent in the plating solution and, as depicted in FIG. 1D, deposit as a silver plated electrode layer 26 onto the silver diffusion layer 20 to a desired thickness.

A preferred chemical reducing agent for use with a silver electroless plating process comprises a mixture of glucose and tartaric acid in a ratio (g/g) of about 1:0.1. Examples of other suitable chemical reducing agents include organic and inorganic compounds, such as potassium hypophosphite, ammonium hypophosphite, aldehydes such as formaldehyde and glyoxal, potassium borohydride, amine boranes, hydrazine, hydrazine sulfate, Rochelle salt (potassium sodium tartrate), ascorbic acid, and the like.

Optional additives can be added to increase the rate of deposition, increase the stability of the bath, and/or function as a buffer or mild complexing agent. Examples of suitable additives include acetic acid, sodium acetate, sodium fluoride, lactic acid, propionic acid, sodium pyrophosphate, ethylenediamine, thallous nitrate, boric acid, citric acid, hydrochloric acid, malonic acid, glycine, malic acid, mercaptobenzothiazole, sodium lauryl sulfate, lead (II) ion, sodium potassium tartrate, ammonium hydroxide, potassium hydroxide, sodium hydroxide, sodium carbonate, ethylenediaminetetraacetic acid, methyldichlorosilane and tetrasodium ethylenediaminetetraacetic acid, sodium citrate, ammonium chloride, ammonium sulfate, sodium succinate, sodium sulfate, and the like, and mixtures thereof.

In a silver electroless plating process, the thickness of the upper electrode 28 is controlled by the length of time that the substrate 12 is immersed in the aqueous coating solution. Preferably, the substrate 12 is immersed in the bath to deposit a quantity of silver onto the diffusion layer 20 to a thickness of about 400 angstroms to about 1500 angstroms, or a total thickness (diffusion layer 20+plated electrode layer 26) of about 500 angstroms to about 2000 angstroms. The solution can be gently agitated to more uniformly and efficiently deposit silver onto the diffusion layer 20 to form the plated electrode layer 26.

To terminate the metal deposition in an electroless plating, the substrate 12 is removed and placed in a rinse bath. The rinse bath can comprise water, an alcohol such as ethanol or isopropanol, or other organic liquid that is chemically inert to the silver coating and will displace the coating solution from the substrate 12 surface. The substrate 12 is held in the rinse bath until the coating solution has been displaced. Preferably, the rinse solution is gently agitated to more rapidly remove the coating solution from the surface. After rinsing, the substrate 12 can be removed from the rinse bath and allowed to dry, or can be spin dried.

Figure 1E:
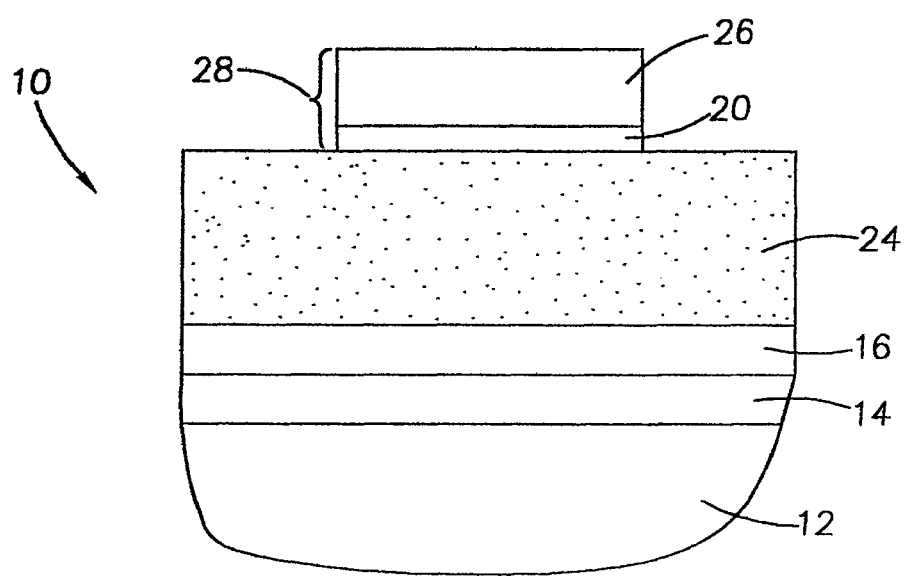

The plated electrode layer 26 (and diffusion layer 20) can then be patterned to form the upper electrode 28, as depicted in FIG. 1E, by conventional photolithography processing using a photoresist mask and a wet or, preferably, a dry etch procedure. The plated electrode layer 26 can also be partially removed by conventional chemical mechanical polishing (CMP).

In use, when a voltage is applied, a dendrite (not shown) is formed between the upper electrode 28 and the lower electrode 16.

According to this embodiment of the method of the invention, the diffusion of metal ions into the chalcogenide material 18 to form the resistance variable material layer 24 is controlled by limiting the silver (or other metal) sputtering step to the formation of a thin diffusion layer, and then depositing the mass of the electrode by plating. The present process controls the diffusion of metal ions into the chalcogenide material 18 to achieve a suitably functional memory device.

Figure 2A:
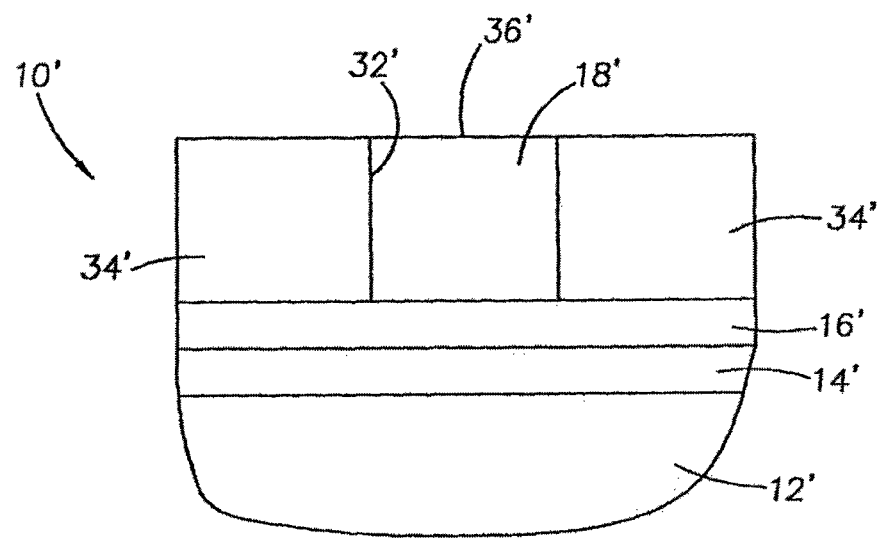
FIG. 2A is a diagrammatic cross-sectional view of a semiconductor wafer fragment at a preliminary step of a processing sequence.
Figure 2B:
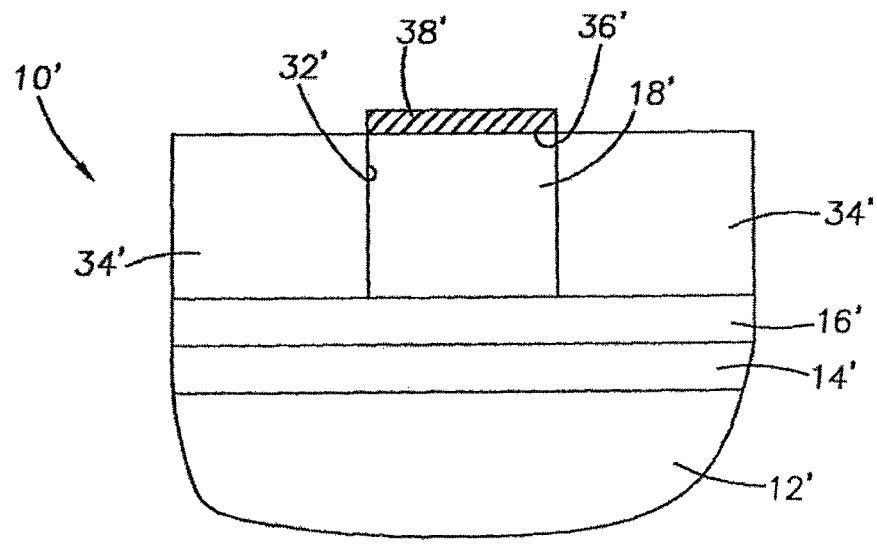
FIGS. 2B through 2F are views of the wafer fragment of FIG. 2A at subsequent and sequential processing steps, showing fabrication of a conductive contact according to another embodiment of the method of the invention.
Figure 2C:
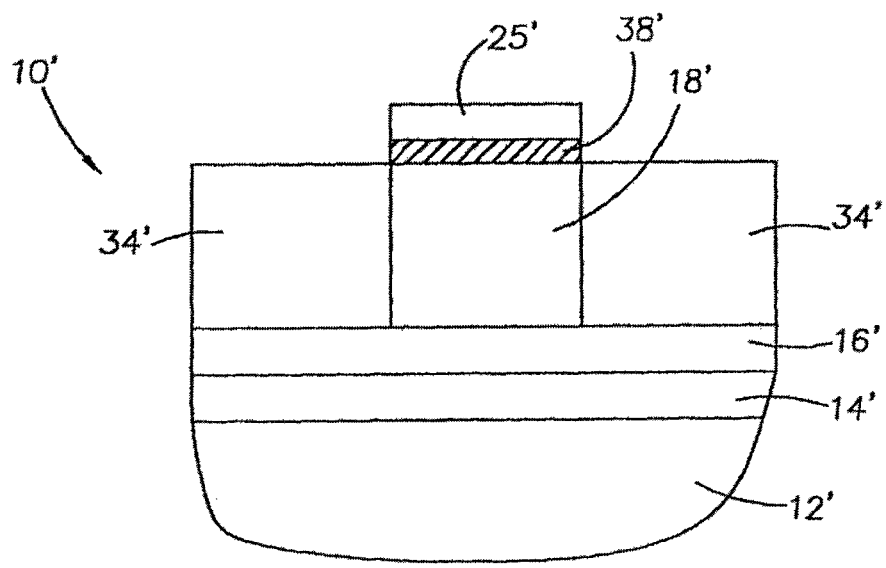

Referring now to FIGS. 2A through 2F, in another embodiment of a method according to the invention, a surface 36' of chalcogenide material layer 18' is pre-activated, and a metal, for example, being silver or copper, being silver in the illustrated example, is deposited onto the activated areas by electroless plating to form a diffusion layer 25' (FIG. 2C). A conformal metal layer 26' of the same or a different metal can be deposited by electroless or electroplating to form an upper electrode layer 28', also being silver in the illustrated example.

Referring to FIG. 2A, a wafer fragment 10' is shown before processing. Briefly, wafer fragment 10' includes a supportive substrate 12', an overlying insulating layer 14' (if appropriate), a lower electrode 16', and the overlying chalcogenide material 18', which is preferably germanium selenide. As depicted, the insulating layer 14' has been formed over the substrate 12', and the chalcogenide material 18' has been deposited within an opening 32' (e.g., via) formed through an insulating layer 34' and overlying the lower electrode 16'.

According to the invention, the surface 36' of the chalcogenide material 18' is contacted with a surface-activating agent to form an activated surface area(s) 38' over chalcogenide material 18', as depicted in FIG. 2B. The surface-activating agent functions to chemically activate the surface 36' of the chalcogenide material 18' for initiating metal deposition in an electroless plating process. A preferred surface-activating agent comprises a colloidal suspension of palladium (Pd) or palladium chloride ($PdCl_2$) as a catalyst, and a tin (Sn) species such as stannous chloride ($SnCl_2$) as a stabilizer, as known and used in the art. The wafer fragment 10' can be dipped into an aqueous solution comprising the surface-activating agent to coat the chalcogenide material 18', preferably for about 10 seconds to about 150 seconds. A multi-step process can also be used, for example, by dipping the wafer fragment 10' in a $SnCl_2$ solution, rinsing the wafer fragment 10', and then dipping the wafer fragment 10' in a palladium or $PdCl_2$ solution.

The wafer fragment 10' is then placed into a rinse bath comprising water or other compatible solvent, for example, an alcohol such as ethanol or isopropanol, to remove the surface-activating agent solution. Activated surface areas 38' on the chalcogenide material 18' comprise small island nucleation sites of palladium that initiate deposition of silver thereon in a subsequent silver plating step.

Referring to FIG. 2C, silver is plated as the conformal diffusion layer 25' onto the activated surface areas 38' of the chalcogenide material 18' in an electroless plating process by immersing the substrate 12' in an aqueous bath comprising silver metal ions and a chemical reducing agent, as discussed above. The plating step proceeds until the diffusion layer 25' is formed, preferably to a thickness of about 300 angstroms or less, preferably about 100 angstroms to about 300 angstroms. The substrate 12' is then removed from the metal ion bath, placed in a rinse bath to terminate deposition, and dried.

Figure 2D:
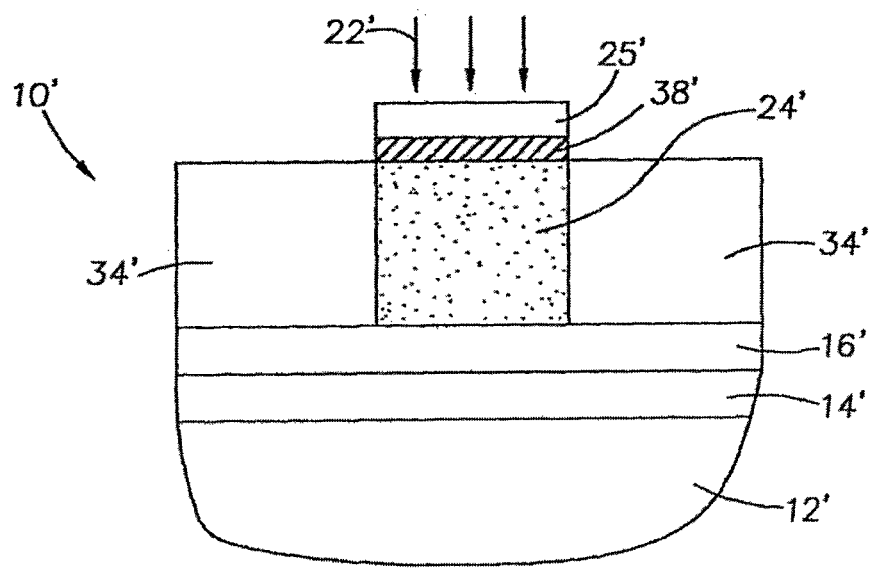

The diffusion layer 25' is then exposed to electromagnetic radiation or other diffusion source 22' to diffuse metal ions (e.g., silver ions) from the diffusion layer 25' into the chalcogenide material 18', resulting in a resistance variable material layer 24', as depicted in FIG. 2D.

Figure 2E:
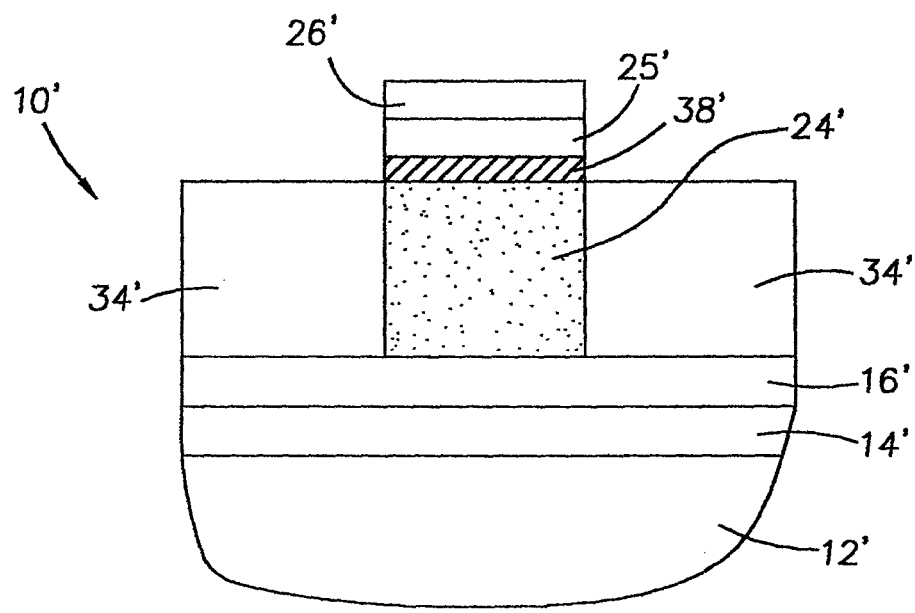

Referring to FIG. 2E, the conformal metal layer 26' is then plated over the diffusion layer 25' in an electroless or electroplating process. The plating step proceeds until a desired mass and thickness is achieved, preferably to a thickness of about 500 angstroms to about 2000 angstroms. Where the diffusion layer 25' has been depleted from the foregoing diffusion step, a seed layer (not shown) of a conducting metal can be plated onto the resistance variable material layer 24' as a base for the conformal metal layer 26' of a top electrode.

Where the underlying diffusion layer 25' is less than about 100 angstroms, the seed layer is preferably plated using an electroless plating process.

Figure 2F:
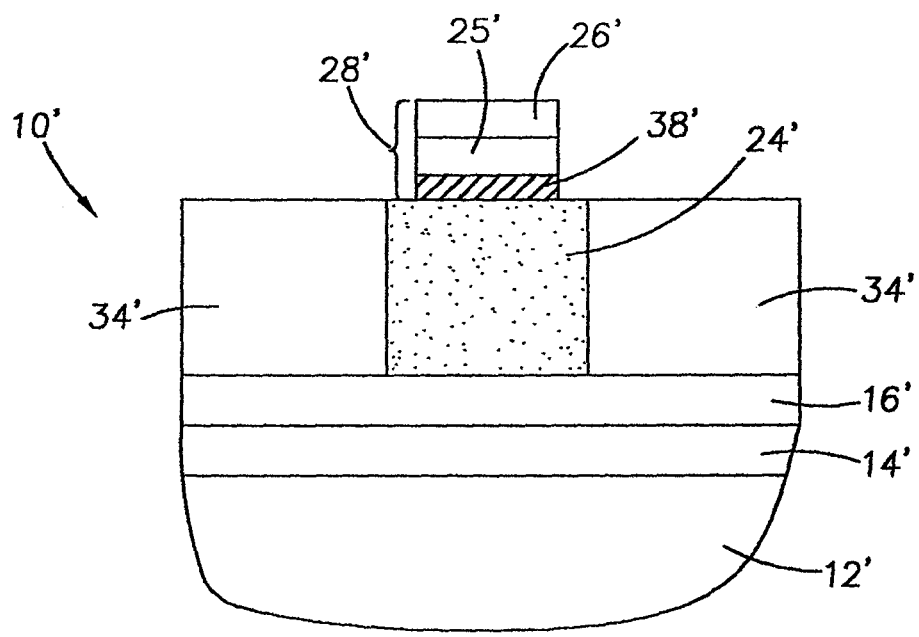

As depicted in FIG. 2F, the conformal metal layer 26' (and diffusion layer 25') can be patterned by conventional photo-lithographic methods and/or partially removed by conventional CMP to form the upper electrode 28'.

In the present embodiment of the method, diffusion of metal ions into the chalcogenide material 18' to form the resistance variable material layer 24' is controlled by omitting the metal sputtering step and forming the diffusion layer 25' by electroless plating, diffusing metal into the chalcogenide material 18' from the diffusion layer 25', and then depositing the conformal metal layer 26' by an electroless or electroplating process.

The resulting non-volatile resistance variable devices can be used in a variety of applications including, for example, programmable memory devices, programmable resistor and capacitor devices, optical devices, and sensors, among others.

EXAMPLES 1-3

Electroplating of Silver Electrode onto a Silver Seed Layer

A silver electrode was formed over a layer of germanium selenide on a semiconductor wafer according to an embodiment of the method of the invention.

In a series of experimental wafers, the electrode was formed by first sputtering a layer of silver onto the germanium selenide layer, to form a seed layer, and then plating silver onto the seed layer for a designated plating time by conventional electroplating using an EG&G model 270 and the processing parameters shown. The thickness of the seed layer varied from 250 angstroms to 400 angstroms.

With the Control wafers, the electrode was formed by sputtering a layer of silver onto the germanium selenide layer to a thickness of 150 angstroms to 700 angstroms.

Example 1

Figure 3A:
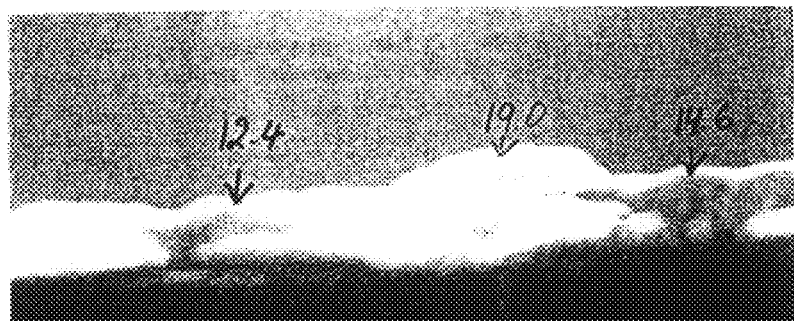
FIGS. 3A through 3C are cross-sectional views of scanning electromicrographs (SEMs) of a series of wafers comprising a germanium selenide layer, an overlying silver diffusion layer, and a layer of silver electroplated onto the diffusion layer as described in Example 1.

Solution: 100 ml of TECHNI SILVER® CY-Less L2 (Technic, Inc., Cranston, R.I.)
Wafer: ca. 4 cm×5 cm; Ag seed layer thickness=250 Å
Potential: −0.05 V
Plating Time: 120 seconds
Temperature: ambient
Resistance:
Pre-Plating (avg.): 2.76 ohms/square
Post-Plating (avg.): 0.66 ohms/square
SEMs: FIG. 3A (Experimental)

Example 2

Figure 3B:
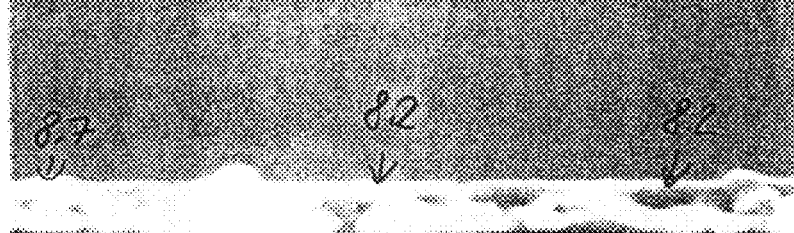

Solution: 100 ml of TECHNI SILVER® CY-Less L2 (Technic, Inc., Cranston, R.I.)
Wafer: ca. 4 cm×5 cm; Ag seed layer thickness=150 Å
Potential: −0.05 V
Plating Time: 120 seconds
Temperature: ambient
Resistance:
Pre-Plating (avg.): 5.7 ohms/square
Post-Plating (avg.): 1.70 ohms/square
SEMs: FIG. 3B (Experimental)

Example 3

Solution: 100 ml of TECHNI SILVER® CY-Less L2 (Technic, Inc., Cranston, R.I.)

Figure 3C:
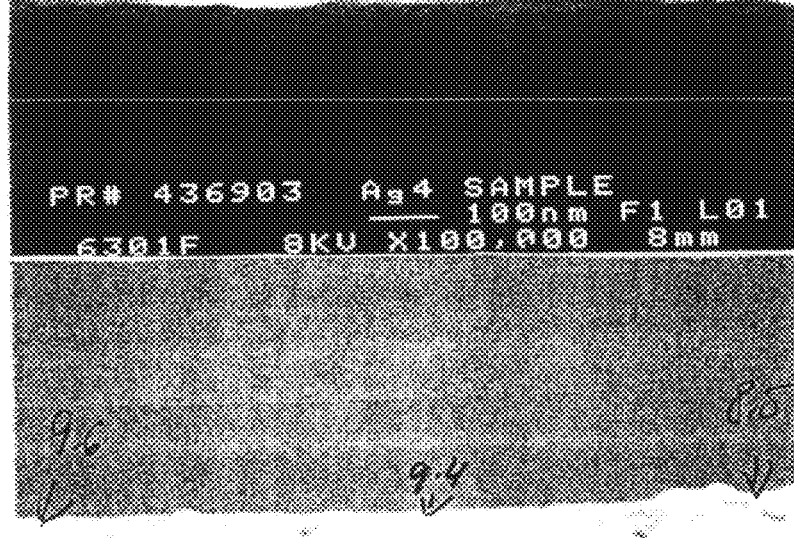
Figure 3C:
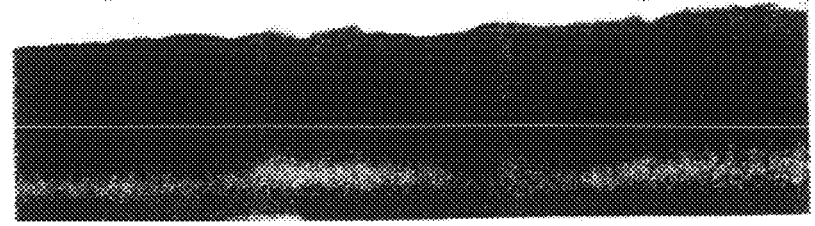
Figures 3A, 3B, 3C:
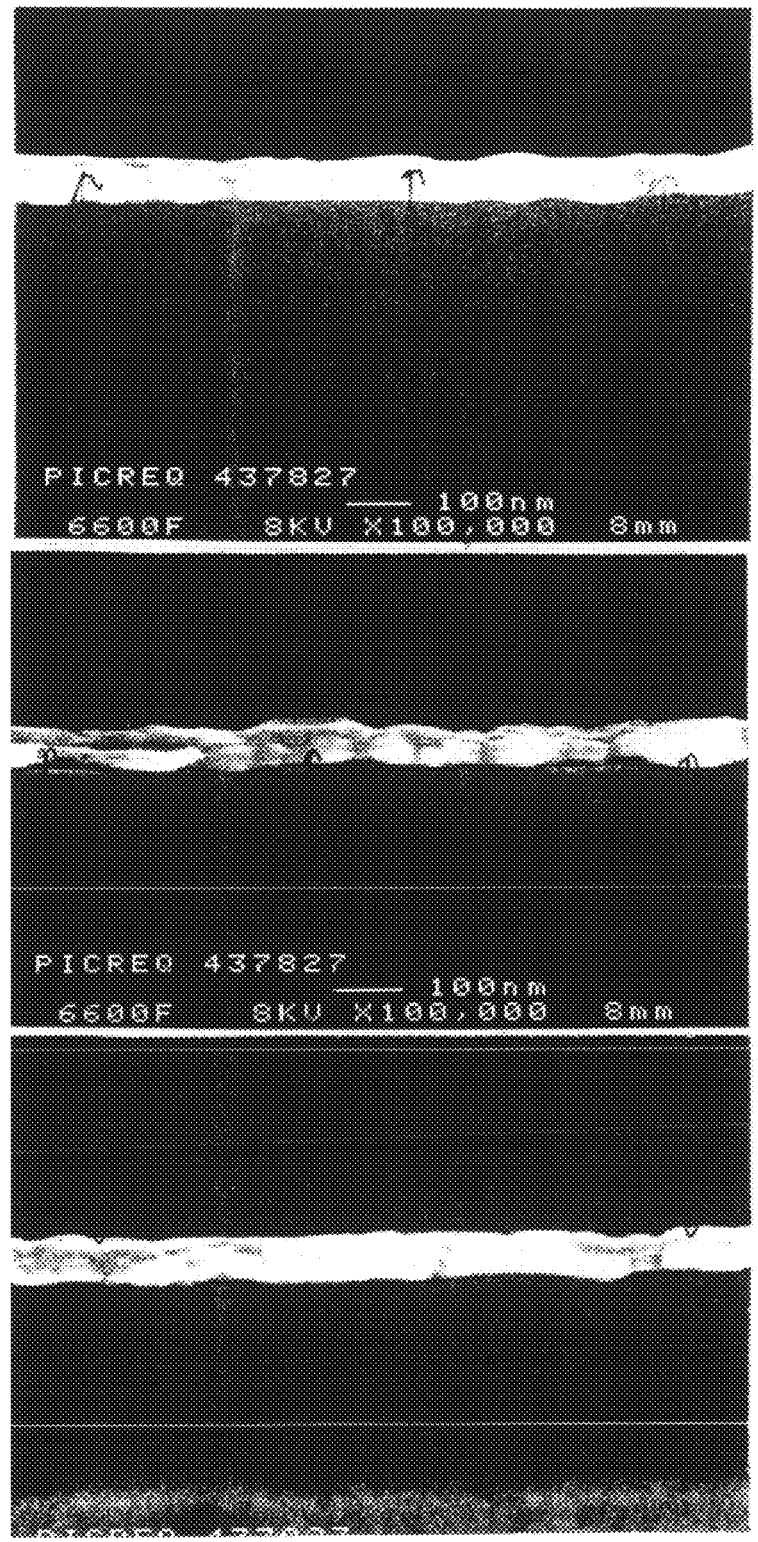

Wafer: ca. 4 cm×5 cm; Ag seed layer thickness=ca. 600 Å
Potential: −0.05 V
Plating Time: 120 seconds
Temperature: ambient
Resistance:
Pre-Plating (avg.): 1.44 ohms/square
Post-Plating (avg.): 0.96 ohms/square
SEMs: FIG. 3C (Experimental)
FIGS. 3A', 3B', 3C' (Control)

A decrease in resistance is evidence of increased silver thickness, proving that plating was successful. This is demonstrated further by the (SEM) images shown in FIGS. 3A through 3C. The results demonstrated that a thin sputtered silver layer can be used as a plating seed to further increase the silver thickness without the generation of electromagnetic radiation.

EXAMPLES 4 AND 5

Electroless Plating of Silver Electrode onto a Silver Seed Layer

A silver electrode was formed over a layer of germanium selenide on a semiconductor wafer, according to a method of the invention.

In a series of experimental wafers, a silver electrode was formed by first sputtering a layer of silver onto a germanium selenide layer on a semiconductor wafer, to form a seed layer. The thickness of the seed layer varied from 150 angstroms to 400 angstroms. Silver was then plated onto the seed layer for a designated plating time by conventional electroless plating using the processing parameters shown below.

With the Control wafers, the electrode was formed by sputtering a layer of silver onto the germanium selenide layer on a wafer.

Example 4

Plating Solution $AgNO_3$ (0.3 g)
$NH_4OH$ (0.3 ml)
KOH (0.5 ml)
Glucose (3.87 g)
Tartaric acid (0.35 g)
Isopropyl alcohol (IPA) (8.75 ml)
$H_2O$ (total of 92.7 ml)
Wafer: ca. 4 cm×4 cm, Ag seed layer thickness=200 Å
Plating Time: 300 seconds
Temperature: Ambient to begin with, but plating was very slow. After 15 minutes, the bath was slightly warmed. The bath decomposed upon heating within 15 minutes.
Resistance:
Pre-Plating (avg.): 4.22 ohms/square
Post-Plating (avg.): 2.52 ohms/square Example 5

Plating Solution $AgNO_3$ (0.35 g)
$NH_4OH$ (until precipitate dissolved)
KOH (0.35 ml)
Glucose (4.50 g)
Tartaric acid (0.4 g)
Ethanol (10 ml)
$H_2O$ (total of 106 ml)
Wafer: ca. 4 cm×4 cm, Ag seed layer thickness=200 Å
Plating Time: 300 seconds
Temperature: Ambient to begin with, but plating did not seem to start or was very slow. After 15 minutes, the bath was slightly warmed to about 30° C. The bath decomposed upon heating within 30 minutes.
Resistance:
Pre-Plating (avg.): 4.51 ohms/square
Post-Plating (avg.): 2.37 ohms/square The silver layer formed on the experimental wafers by electroless plating onto the silver seed layer over the germanium selenide layer had an increased thickness as evidenced by the decrease in resistance after plating.

The experimental silver layers also had a greater thickness compared to the corresponding Control wafers. The resistance of the silver layer in the Control wafers was about 4.5 ohms/square (pre-plating), and about 2.3 ohms/square (post-plating). This indicates that the silver thickness increased from about 200 angstroms to 300 angstroms.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a fast ion conductor structure, comprising:
    forming a metal material on a chalcogenide material by chemical vapor deposition;
    diffusing metal ions from the metal material into the chalcogenide material to form a fast ion conductor; and
    electroless plating a conductive material over the fast ion conductor to form an electrode.

2. The method of claim 1, wherein forming a metal material on a chalcogenide material comprises forming silver on the chalcogenide material by chemical vapor deposition.

3. The method of claim 1, wherein forming a metal material on a chalcogenide material comprises forming the metal material on the chalcogenide material comprising germanium.

4. The method of claim 1, wherein forming a metal material on a chalcogenide material comprises forming the metal material on the chalcogenide material having a formula $B_xA_y$, where B is arsenic or germanium and A is selected from the group consisting of selenium, tellurium, and sulfur.

5. The method of claim 1, wherein diffusing metal ions comprises exposing the metal material to electromagnetic radiation.

6. The method of claim 1, wherein diffusing metal ions comprises exposing the metal material to heat during irradiation.

7. A method of forming a fast ion conductor structure, comprising:
    forming a metal material on another material by chemical vapor deposition, the another material selected from the group consisting of a chalcogenide glass material, an amorphous semiconductor material, and a superionic conductor material;
    diffusing metal ions from the metal material into the another material to form a fast ion conductor; and
    reducing metal ions from a salt solution to deposit additional metal material on the fast ion conductor.

8. A method of forming a nonvolatile memory device, comprising:
    forming a metal material from about 100 angstroms to about 300 angstroms thick on a chalcogenide material on and in contact with a first electrode by a process selected from the group consisting of physical vapor deposition and chemical vapor deposition;
    diffusing metal ions from the metal material into the chalcogenide material to form a fast ion conductor;
    forming a seed region of a conductive metal material over the fast ion conductor; and electroless plating another metal material over the fast ion conductor to form a second electrode.

9. The method of claim 8, further comprising applying a voltage to the nonvolatile memory device to form a dendrite within the fast ion conductor to connect the first and second electrodes.

10. The method of claim 8, wherein forming a metal material comprises sputtering the metal material.

11. A method of forming a nonvolatile memory device, comprising:
    contacting a surface of a chalcogenide material with a surface activating agent to form at least one nucleation site, the chalcogenide material on and in contact with a first electrode;
    plating a metal material to a thickness of from about 100 angstroms to about 300 angstroms onto the at least one nucleation site;
    diffusing metal ions from the metal material into the chalcogenide material to form a fast ion conductor;
    plating another metal material over the fast ion conductor to form a second electrode; and
    applying a voltage to form a dendrite within the fast ion conductor between the first and second electrodes.

12. The method of claim 11, wherein at least one of plating a metal material and plating another metal material comprises electroless plating.

13. The method of claim 11, further comprising, prior to plating the another metal material over the fast ion conductor to form the second electrode, forming a metal seed over the fast ion conductor.

14. A method of forming a phase changeable memory device, comprising:
    forming a chalcogenide material on and in contact with a first electrode;
    forming a metal material about 100 angstroms to about 300 angstroms thick on the chalcogenide material by a process selected from the group consisting of physical vapor deposition, chemical vapor deposition, and plating;
    diffusing metal ions from the metal material into the chalcogenide material to form a fast ion conductor;
    plating another material over the fast ion conductor to form a second electrode; and
    applying a voltage to form a dendrite within the fast ion conductor material and connecting the first and second electrodes.

* * * * *

UNITED STATES PATENT AND TRADEMARK OFFICE
CERTIFICATE OF CORRECTION

PATENT NO. : 8,623,694 B2
APPLICATION NO. : 12/763430
DATED : January 7, 2014
INVENTOR(S) : Rita J. Klein Page 1 of 1

It is certified that error appears in the above-identified patent and that said Letters Patent is hereby corrected as shown below:

On the Title page, in item (57), under "Abstract", in column 2, line 16, delete "chalogenide" and insert -- chalcogenide --, therefor.

Signed and Sealed this
Fifteenth Day of April, 2014

Michelle K. Lee
*Deputy Director of the United States Patent and Trademark Office*